US012804865B2

(12) United States Patent
Sun

(10) Patent No.: US 12,804,865 B2
(45) Date of Patent: Nov. 17, 2026

(54) DISPLAY DEVICE

(71) Applicant: XIAMEN TIANMA DISPLAY TECHNOLOGY CO., LTD., Xiamen (CN)

(72) Inventor: Jingzhong Sun, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 256 days.

(21) Appl. No.: 18/731,358

(22) Filed: Jun. 3, 2024

(65) Prior Publication Data

US 2024/0324154 A1 Sep. 26, 2024

(30) Foreign Application Priority Data

Jul. 31, 2023 (CN) ......................... 202310948638.7

(51) Int. Cl.
*H05K 7/20* (2006.01)
*G09F 9/30* (2006.01)

(52) U.S. Cl.
CPC ........... *H05K 7/20963* (2013.01); *G09F 9/30* (2013.01); *H05K 7/20472* (2013.01); *H05K 7/20509* (2013.01); *H05K 7/20954* (2013.01)

(58) Field of Classification Search
CPC ........... H05K 7/20963; H05K 7/20472; H05K 7/20509; H05K 7/20954; G09F 9/30
USPC ........................................................... 361/688
See application file for complete search history.

(56) References Cited

U.S. PATENT DOCUMENTS 5,982,617 A * 11/1999 Haley ...................... G06F 1/203 361/679.46
6,052,280 A * 4/2000 Dilley ...................... G06F 1/203 174/15.2
6,097,597 A * 8/2000 Kobayashi ............ H10W 40/73 361/717
7,352,582 B2 * 4/2008 Yokoyama ........... H10K 59/871 361/679.48
7,561,427 B2 * 7/2009 Jeong ................. H05K 7/20963 361/690
8,153,903 B2 * 4/2012 Kanouda ................ H05K 7/142 361/720

(Continued)

FOREIGN PATENT DOCUMENTS

CN 207939941 U 10/2018
CN 212966870 U 4/2021

(Continued)

OTHER PUBLICATIONS

Office Action of Corresponding Cn Patent Application No. 202310948638.7 Dated Oct. 23, 2025.

*Primary Examiner* — Anatoly Vortman
(74) *Attorney, Agent, or Firm* — KILPATRICK TOWNSEND & STOCKTON LLP

(57) ABSTRACT

A display device is provided. By arranging a first heat conductive film layer and a second heat conductive film layer around the heat source device, the first heat conductive film layer is used to rapidly transfer the heat generated by the heat source device to the second heat conductive film layer, and then the second heat conductive film layer with the surface thermal conductivity is used to dissipate the heat on the surface rapidly and uniformly, to conduct the heat generated by the heat source device to the outside fast.

20 Claims, 6 Drawing Sheets

(56) References Cited

U.S. PATENT DOCUMENTS

| | | | | |
|---|---|---|---|---|
| 8,391,010 | B2 * | 3/2013 | Rothkopf | H04M 1/185 361/708 |
| 8,400,607 | B2 * | 3/2013 | Cappaert | G02F 1/133385 349/161 |
| 8,625,282 | B2 * | 1/2014 | Chen | H05K 7/2039 361/710 |
| 9,049,804 | B2 * | 6/2015 | Lang | H05K 7/20963 |
| 11,044,829 | B1 | 6/2021 | Wu | |
| 11,224,149 | B2 * | 1/2022 | Ma | H05K 7/20954 |
| 2007/0216670 | A1 * | 9/2007 | Yatsu | G09G 3/22 345/205 |
| 2007/0247807 | A1 * | 10/2007 | Kondo | H01J 9/52 361/705 |
| 2012/0092562 | A1 * | 4/2012 | Omiya | H04N 5/64 362/249.07 |
| 2014/0160674 | A1 * | 6/2014 | Yamakita | H10K 59/8794 361/679.54 |
| 2016/0155683 | A1 | 6/2016 | Kim et al. | |
| 2018/0235073 | A1 * | 8/2018 | Ma | H05K 7/2039 |
| 2021/0037683 | A1 | 2/2021 | Ma et al. | |
| 2022/0121311 | A1 | 4/2022 | Li et al. | |

FOREIGN PATENT DOCUMENTS

| | | | |
|---|---|---|---|
| CN | 113964150 | A | 1/2022 |
| CN | 114973956 | A | 8/2022 |

* cited by examiner

DISPLAY DEVICE

This application claims priority to Chinese Patent Application No. 202310948638.7, titled "DISPLAY DEVICE", filed on Jul. 31, 2023 with the China National Intellectual Property Administration, which is hereby incorporated by reference in its entirety.

FIELD

The present disclosure relates to the field of display technology, and in particular to a display device.

BACKGROUND

With the constant advancement of science and technology, it is a higher demand for a display device to improve its performance and display quality.

As the resolution of the display device is increasing, some heat source devices in the display device can generate more heat while running. Such a large amount of heat can cause abnormal display of the display device, or even worse, operation failure of the display panel.

A conventional heat dissipation method in conventional technology is to simply add some stacked sheet heat dissipation materials between the heat source devices. However, due to disadvantages of each heat dissipation material, the simple stacking of sheet heat dissipation materials cannot make full use of advantages of each heat dissipation material. In addition, as the heat source devices of the display device generate more heat, such conventional heat dissipation method fails to meet the heat dissipation requirements of the current display device.

Therefore, it is an urgent problem to be solved how to effectively dissipate heat for the display device.

SUMMARY

In view of this, in order to solve the above problems, a display device is provided according to the present disclosure. The embodiments are as follows.

A display device, the display device includes:

a display panel;

a heat source device, located on the display panel;

a first heat conductive film layer, located at a side of the display panel, where the first heat conductive film layer covers the heat source device; and a second heat conductive film layer, located inside the first heat conductive film layer, where the second heat conductive film layer at least partially surrounds the heat source device;

where the first heat conductive film layer is configured to transfer heat generated by the heat source device to the second heat conductive film layer, and the second heat conductive film layer is configured to dissipate the received heat uniformly on a plane where the second heat conductive film layer is located.

Compared with the conventional technology, beneficial effects achieved by the present disclosure are as follows.

In a display device provided by the present disclosure, a first heat conductive film layer and a second heat conductive film layer are arranged around the heat source device, and the heat generated by the heat source device is rapidly transferred to the second heat conductive film layer by using the first heat conductive film layer, then the second heat conductive film layer with surface thermal conductivity is used to dissipate the heat on the surface rapidly and uniformly, to conduct the heat generated by the heat source device to the outside fast.

BRIEF DESCRIPTION OF THE DRAWINGS

In order to illustrate the embodiments of the present disclosure more clearly, drawings used in the description of the embodiments are described briefly hereinafter. Apparently, the drawings described in the following illustrate only some embodiments of the present disclosure.

DETAILED DESCRIPTION OF EMBODIMENTS

The embodiments of the present disclosure are described clearly and completely in conjunction with the drawings of the embodiments of the disclosure hereinafter. It is apparent that the described embodiments are only some, rather than all, embodiments of the present disclosure.

In order to clarify the embodiments of the present disclosure more comprehensible, the present disclosure is further described in detail below in conjunction with the drawings and specific embodiments.

Figure 1:
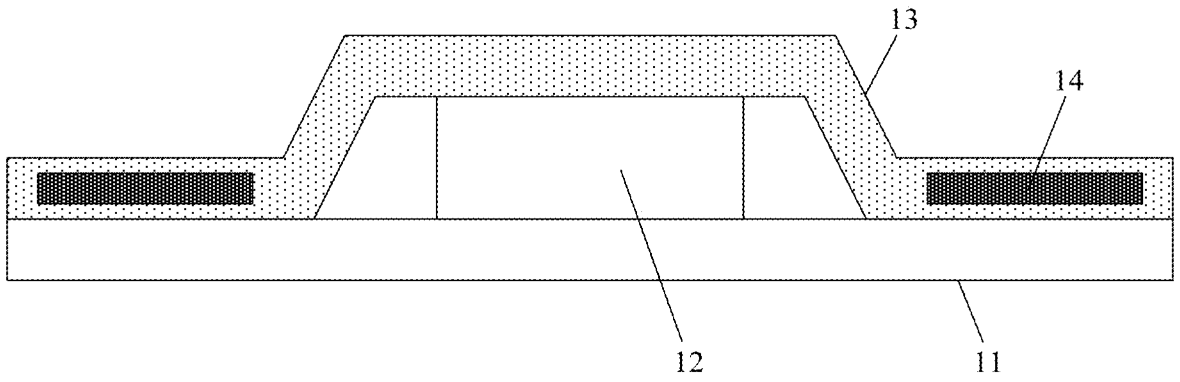
FIG. 1 is a schematic diagram of a partial structure of a display device according to an embodiment of the present disclosure.
Figure 2:
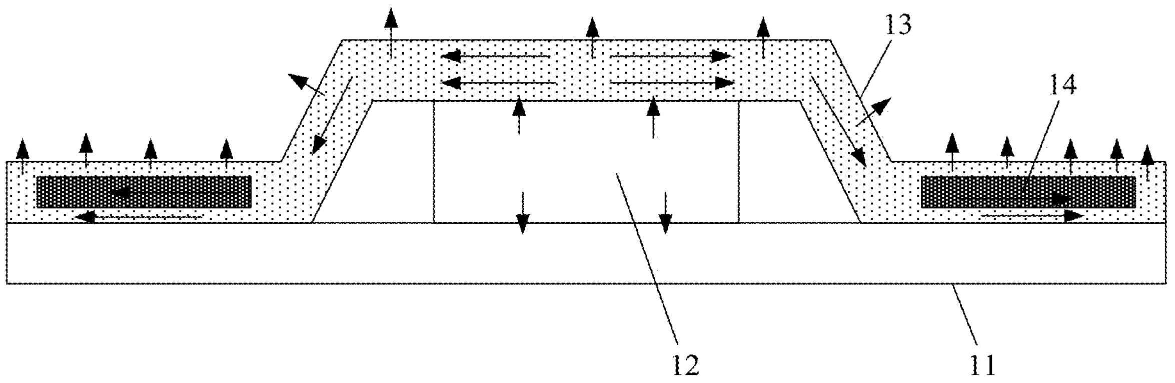
FIG. 2 is a schematic diagram of heat dissipation in a display device according to an embodiment of the present disclosure.

FIG. 1 is a schematic diagram of a partial structure of a display device according to an embodiment of the present disclosure. FIG. 2 is a schematic diagram of heat dissipation in a display device according to an embodiment of the present disclosure. As shown in FIGS. 1 and 2, the display device includes:

a display panel 11;

a heat source device 12, located on the display panel 11;

a first heat conductive film layer 13, located on a side of the display panel 11, wherein the first heat conductive film layer 13 covers the heat source device 12;

a second heat conductive film layer 14, located inside the first heat conductive film layer 13, wherein the second heat conductive film layer 14 at least partially surrounds the heat source device 12.

The first heat conductive film layer 13 is configured to transfer heat generated by the heat source device 12 to the second heat conductive film layer 14, and the second heat conductive film layer 14 is configured to dissipate the heat uniformly on a plane where the second heat conductive film layer 14 is located.

In an embodiment of the present disclosure, the first heat conductive film layer 13 may be a heat conductive film layer with isotropic thermal conductivity and good thermal conductivity, i.e., the heat conduction of the first heat conductive film layer 13 is isotropic in X, Y, Z directions. In an embodiment, the first heat conductive film layer 13 may be a metal film layer, for example, a copper foil or other heat conductive film layers.

The second heat conductive film layer 14 may be a heat conductive film layer with excellent surface thermal conductivity. In an embodiment, the second heat conductive film layer 14 may be a graphene film layer or the like.

It should be noted that the first heat conductive film layer 13 is provide as a copper foil and the second heat conductive film layer 14 is provided as a graphene film layer in the embodiment of the present disclosure for illustration.

In other words, in the display device, by arranging the first heat conductive film layer 13 and the second heat conductive film layer 14 around the heat source device 12, the heat generated by the heat source device 12 is rapidly transferred to the second heat conductive film layer 14 by using the first heat conductive film layer 13, the second heat conductive film layer 14 with the surface thermal conductivity is used to dissipate the heat on the surface rapidly and uniformly, to conduct the heat generated by the heat source device 12 to the outside fast.

It should be noted that directions indicated by arrows in FIG. 2 are the directions of heat conduction, where the majority portion of the heat generated by the heat source device 12 is rapidly transferred to the second heat conductive film layer 14 by the first heat conductive film layer 13, and a minority portion of the heat is also directly conducted to the outside through the first heat conductive film layer 13 above the heat source device 12.

The display device provided in embodiments of the present disclosure transfers heat to the surroundings through a composite heat dissipation material by utilizing the isotropic thermal conductivity of a copper foil for heat conduction and the anisotropic thermal conductivity of a graphene film layer for heat spreading.

Furthermore, the second heat conductive film layer 14 is arranged around the heat source device 12, which can effectively reduce the thickness of the material stacked above the heat source device 12 while dissipating the heat, thereby facilitating manufacture of a light and thin display device.

In an embodiment, the heat source device 12 includes, but is not limited to, a driver chip for controlling the operation state of the display device and the like.

Figure 3:
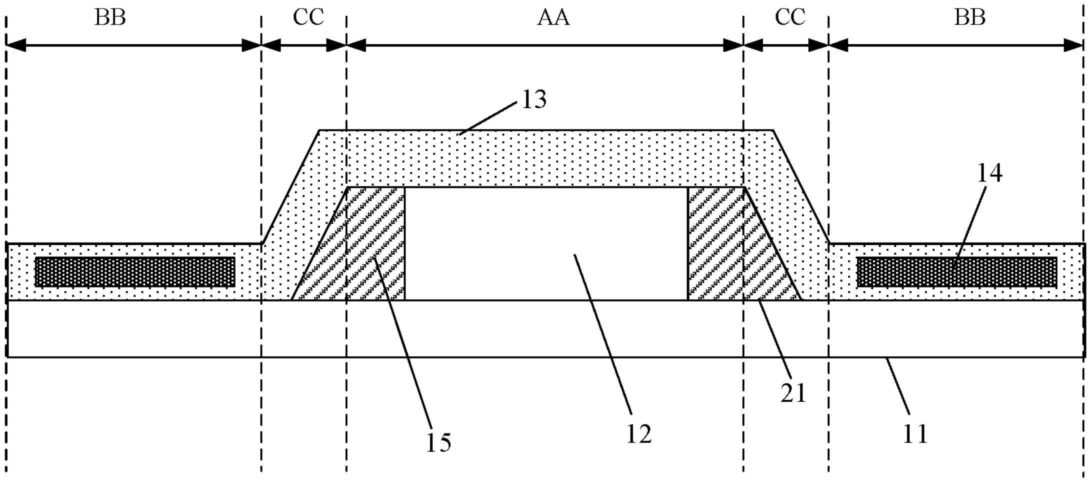
FIG. 3 is a schematic diagram of a partial structure of a display device according to another embodiment of the present disclosure.

FIG. 3 is a schematic diagram of a partial structure of a display device according to another embodiment of the present disclosure.

In an embodiment of the present disclosure, referring to FIG. 3, the first heat conductive film layer 13 includes a first portion AA, second portion(s) BB and third portion(s) CC.

The first portion AA is located at a side of the heat source device 12 away from the display panel 11.

The second portion BB is located at a side of the display panel 11 where the heat source device 12 is arranged.

One end of the third portion CC is in contact with the first portion AA, and another end of the third portion CC is in contact with the second portion BB.

There is a gap 21 between the third portion CC and the heat source device 12, and the second heat conductive film layer 14 is located inside the second portion BB.

As shown in FIG. 3, the display device further includes third heat conductive film layer(s) 15 located between the third portion(s) CC and the heat source device 12.

The third heat conductive film layer 15 is configured to transfer the heat generated by the heat source device 12 to the third portion CC.

In one embodiment of the present disclosure, since the third portion CC is arranged in a tilt manner, there is a certain interval between the third portion CC and the heat source device 12. The third heat conductive film layer 15 may be arranged within this interval. The third heat conductive film layer 15 may be in contact with the heat source device 12 and the third portion CC. In this way, the heat generated from the sidewall of the heat source device 12 can be rapidly conducted to the third portion CC through the third heat conductive film layer 15, and then the heat can be rapidly conducted to the second heat conductive film layer 14 in the second portion BB through the third portion CC. Based on an excellent surface thermal conductivity of the second heat conductive film layer 14, the heat can be transferred uniformly and rapidly, thereby the heat generated by the heat source device 12 can be conducted to outside fast.

In an embodiment, the third heat conductive film layer 15 at least includes a heat conductive adhesive film layer, where a material of the heat conductive adhesive may be a single-component, heat conductive, room temperature curing silicone adhesive sealant. The condensation reaction of moisture in the air releases low molecules to cause cross-linking and curing, and vulcanizes into a high-performance elastomer. The heat conductive adhesive is of performances such as excellent resistance to alternating cold and heat, aging resistance and electrical insulation properties, also has excellent moisture resistance, shock resistance, corona resistance, non-swelling, leakage resistance and chemical media resistance. The heat conductive adhesive can be used continuously in a temperature environment ranging from −60 degrees Celsius to 280 degrees Celsius and maintain its performance. In addition, the heat conductive adhesive has good adhesion to most metallic and non-metallic materials.

In other words, in one embodiment of the present disclosure, the heat conductive adhesive film layer is configured as the third heat conductive film layer 15. On the basis of realizing heat conduction, it can also bond the heat conductive film layer and the heat source device 12 to improve the structural stability performance of the display device.

Figure 4:
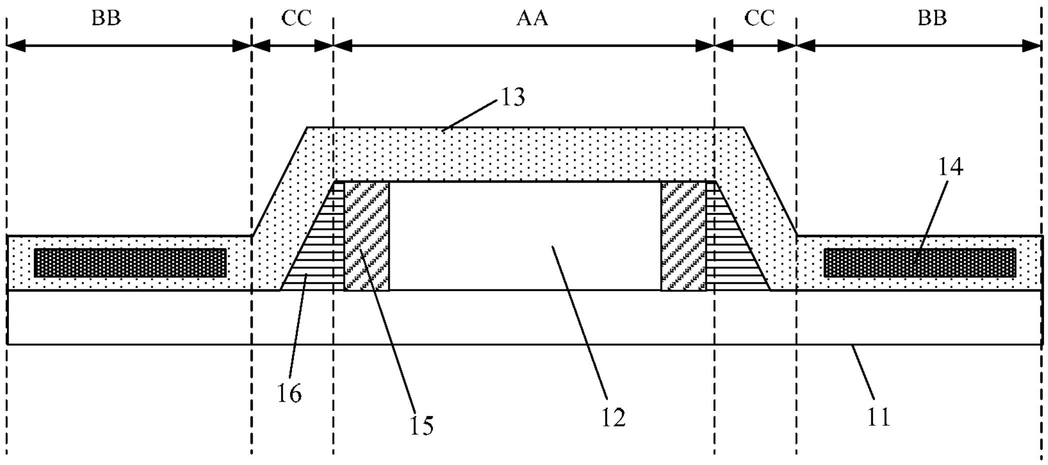
FIG. 4 is a schematic diagram of a partial structure of a display device according to yet another embodiment of the present disclosure.

FIG. 4 is a schematic diagram of a partial structure of a display device according to yet another embodiment of the present disclosure.

In an embodiment of the present disclosure, referring to FIG. 4, the display device further includes: conductive foam(s) 16, located between the third heat conductive film layer 15 and the third portion CC.

In one embodiment of the present disclosure, the conductive foam 16 may be ordinary conductive foam, nickel-plated copper conductive foam, gold-plated conductive foam, carbon-plated conductive foam, tin-plated conductive foam, conductive aluminum foil foam, conductive copper foil foam and the like, which is light and has electromagnetic shielding property. On the basis of heat conduction, it realizes electrostatic protection of the heat source device 12 and prevents external signals from interfering with the heat source device 12.

In the display device shown in FIG. 4, a portion of the heat generated by the heat source device 12 is conducted to the third portion CC of the first heat conductive film layer 13 through the third heat conductive film layer 15 and the conductive foam 16, and then rapidly conducted to the second heat conductive film layer 14 in the second portion BB through the third portion CC. Based on the excellent surface thermal conductivity of the second heat conductive film layer 14, the heat can be transferred uniformly and rapidly, so that the heat generated by the heat source device 12 can be conducted to outside fast.

Figure 5:
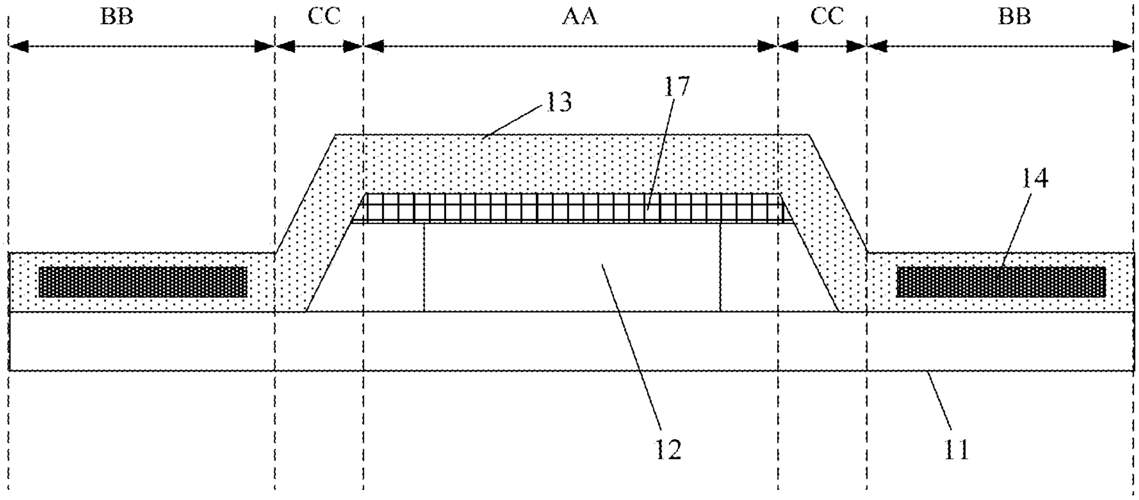
FIG. 5 is a schematic diagram of a partial structure of a display device according to yet another embodiment of the present disclosure.

FIG. 5 is a schematic diagram of a partial structure of a display device according to yet another embodiment of the present disclosure.

In an embodiment of the present disclosure, referring to FIG. 5, the display device further includes: a wave-absorbing material film layer 17, located between the first portion AA and the heat source device 12.

In one embodiment of the present disclosure, a wave-absorbing material film layer 17 is arranged between the first portion AA and the heat source device 12. The wave-absorbing material film layer 17 can also conduct heat and prevent external signals from interfering with the heat source device 12 to improve the operation stability of the heat source device 12.

Figure 6:
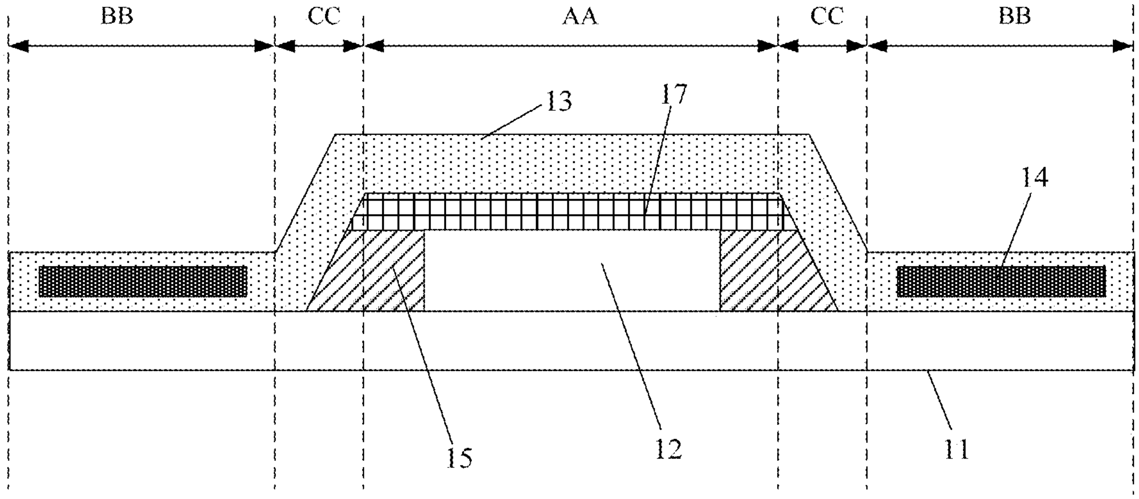
FIG. 6 is a schematic diagram of a partial structure of a display device according to yet another embodiment of the present disclosure.
Figure 7:
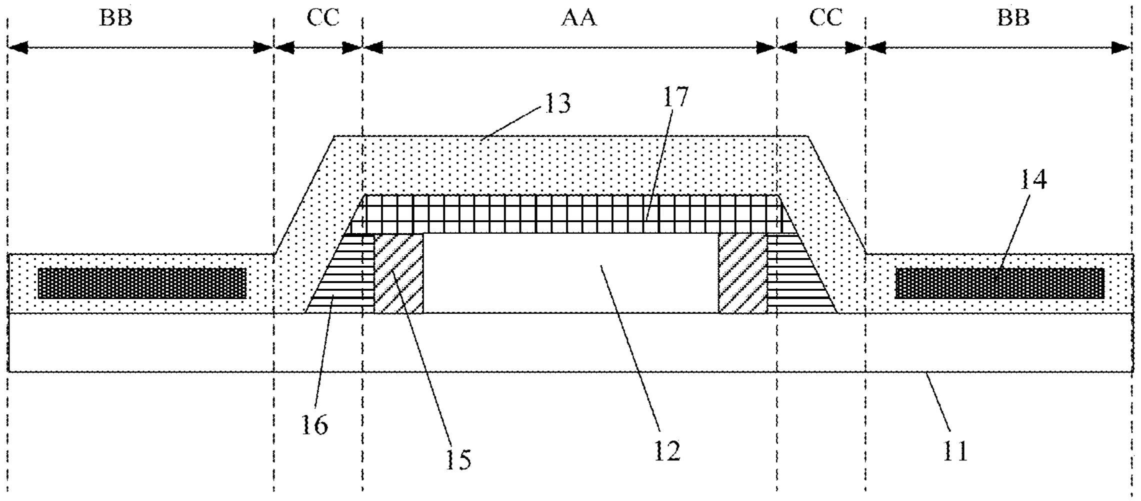
FIG. 7 is a schematic diagram of a partial structure of a display device according to yet another embodiment of the present disclosure.

It should be noted that the third heat conductive film layer 15 and the conductive foam 16 are not provided in FIG. 5. FIG. 6 is a schematic diagram of a partial structure of a display device according to yet another embodiment of the present disclosure. As shown in FIG. 6, the third heat conductive film layer 15 and the wave-absorbing material film layer 17 are arranged. FIG. 7 is a schematic diagram of a partial structure of a display device according to yet another embodiment of the present disclosure. As shown in FIG. 7, the third heat conductive film layer 15, the conductive foam 16 and the wave-absorbing material film layer 17 are arranged. In other words, in an embodiment of the present disclosure, as long as the technical features do not conflict, the technical features can be selectively selected or combined to improve the display device.

Figure 8:
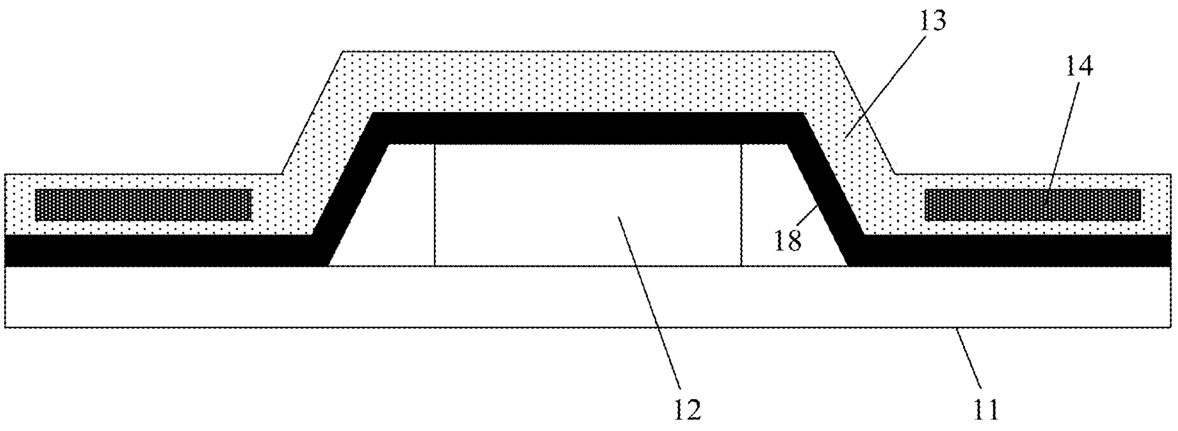
FIG. 8 is a schematic diagram of a partial structure of a display device according to yet another embodiment of the present disclosure.

FIG. 8 is a schematic diagram of a partial structure of a display device according to yet another embodiment of the present disclosure.

In an embodiment of the present disclosure, referring to FIG. 8, the display device further includes: a fourth heat conductive film layer 18, located at a side of the first heat conductive film layer 13 facing the display panel 11.

In an embodiment of the present disclosure, the fourth heat conductive film layer 18 includes, but is not limited to, a modified adhesive film layer. In other words, a high heat conductive filler is added at the side of the first heat conductive film layer 13 facing the display panel 11, to more easily conduct the heat generated by the heat source device 12 to the first heat conductive film layer 13 for rapid heat exchange.

It should be noted that the technical feature of the fourth heat conductive film layer 18 may also be flexibly combined with non-conflicting technical features provided by the above embodiments to improve the display device.

Figure 9:
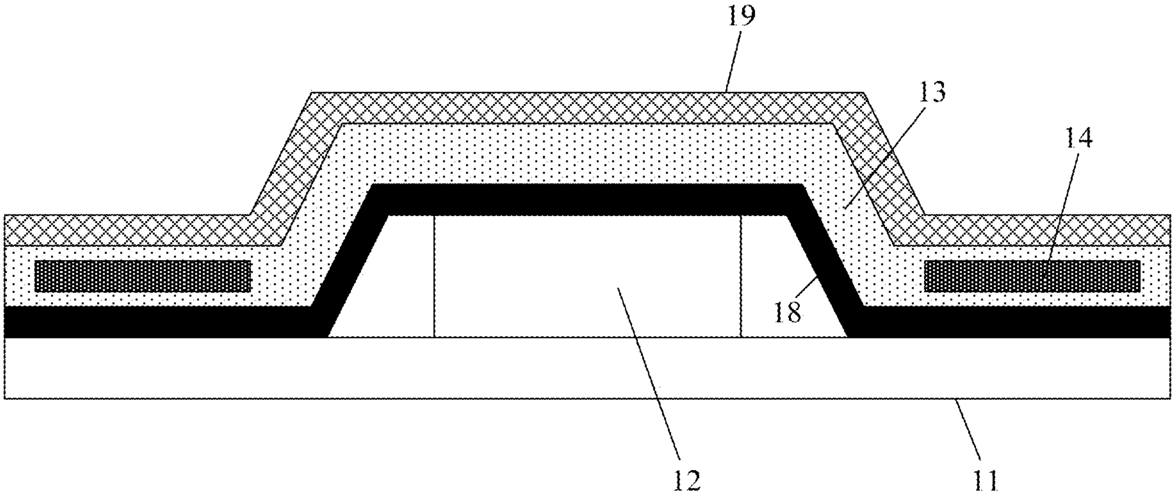
FIG. 9 is a schematic diagram of a partial structure of a display device according to yet another embodiment of the present disclosure.

FIG. 9 is a schematic diagram of a partial structure of a display device according to yet another embodiment of the present disclosure.

In an embodiment of the present disclosure, referring to FIG. 9, the display device further includes: an insulating film layer 19, located at a side of the first heat conductive film layer 13 away from the display panel 11.

In one embodiment of the present disclosure, an insulating film layer 19 is arranged at the side of the first heat conductive film layer 13 away from the display panel 11 to realize insulation protection for the heat conductive film layer and prevent external factors from interfering with the heat conductive film layer. In this way, it can further optimize the thermal conductivity performance of the display device.

Figure 10:
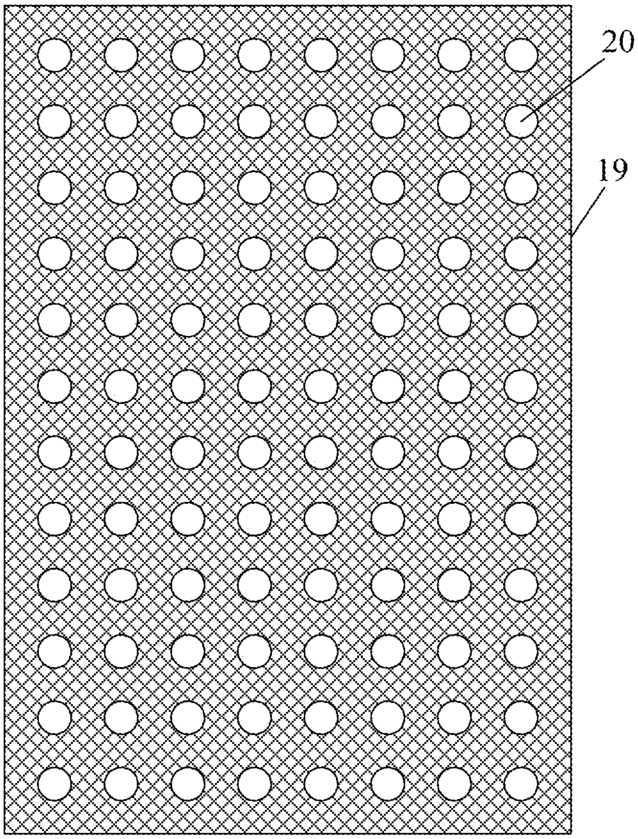
FIG. 10 is a schematic diagram of a top view of an insulating film layer according to an embodiment of the present disclosure.

FIG. 10 is a schematic diagram of a top view of an insulating film layer according to an embodiment of the present disclosure.

In an embodiment of the present disclosure, referring to FIG. 10, the insulating film layer 19 is provided with multiple vias 20 running through the insulating film layer. The multiple vias 20 may be arranged in an array.

In one embodiment of the present disclosure, in order to prevent the insulating film layer 19 from interfering with the heat exchange with the outside, the insulating film layer 19 is provided with multiple vias 20 running through the insulating film layer. In this case, the heat of the entire heat conduction process can be rapidly exchanged with the outside through the multiple vias 20 on the insulating film layer 19.

The multiple vias 20 on the insulating film layer 19 may be arranged in an array, or the vias 20 may be properly arranged based on the heat distribution in the heat conduction process. For example, the density of the vias in the area where the second heat conductive film layer 14 is located may be larger, and the density of the vias of other regions of the first heat conductive film layer 13 not provided with the second heat conductive film layer 14 may be smaller, to ensure that the heat can be conducted out as fast as possible.

Figure 11:
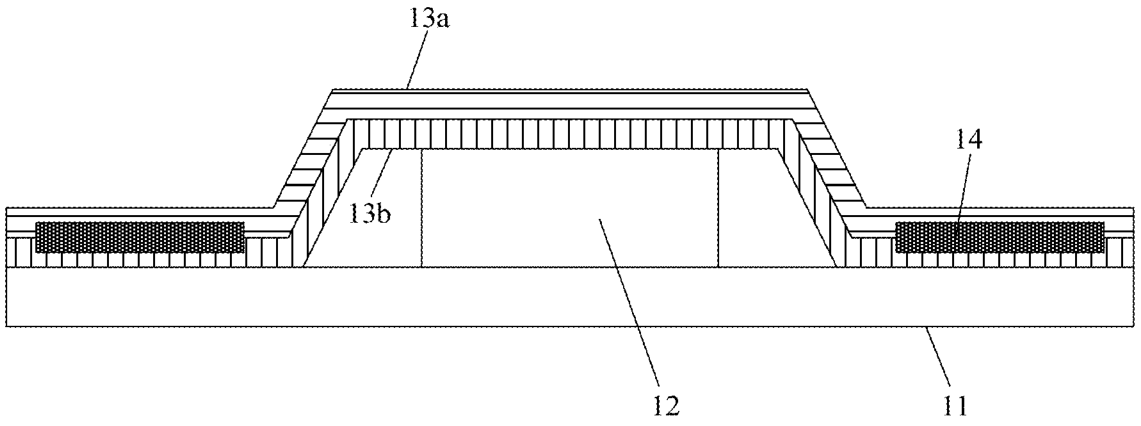
FIG. 11 is a schematic diagram of a partial structure of a display device according to yet another embodiment of the present disclosure.

FIG. 11 is a schematic diagram of a partial structure of a display device according to yet another embodiment of the present disclosure.

In an embodiment of the present disclosure, referring to FIG. 11, the first heat conductive film layer 13 includes a first heat conductive sub film layer 13*a* and a second heat conductive sub film layer 13*b*, arranged in a stacked manner.

The second heat conductive sub film layer 13*b* is located between the first heat conductive sub film layer 13*a* and the display panel 11.

The second heat conductive film layer 14 is located between the first heat conductive sub film layer 13*a* and the second heat conductive sub film layer 13*b*.

In an embodiment of the present disclosure, the first heat conductive film layer 13 may be formed by stacking two heat conductive sub film layers, and the second heat conductive film layer 14 is arranged in a corresponding area between the two heat conductive sub film layers.

It should be noted that the first heat conductive sub film layer 13*a* and the second heat conductive sub film layer 13*b* are heat conductive film layers with isotropic thermal conductivity and good thermal conductivity, that is, the heat conductions of the first heat conductive sub film layer 13*a* and the second heat conductive sub film layer 13*b* are the same in the X, Y, Z directions. In an embodiment, the first heat conductive sub film layer 13*a* and the second heat conductive sub film layer 13*b* may be metal film layers, such as heat conductive film layers such as copper foils. In addition, the materials of the first heat conductive sub film layer 13*a* and the second heat conductive sub film layer 13*b* may be the same or different. In one embodiment, the first heat conductive sub film layer 13*a* and the second heat conductive sub film layer 13*b* are both copper foils as an example for illustration.

A display device provided by the present disclosure has been described in detail above. In this paper, specific examples are used to illustrate the principle and implementation of the present disclosure. The description of the above embodiments is only used to help understand the method and concept of the present disclosure. For those of ordinary skilled in the art, according to the concept of the present disclosure, there may be changes in the specific implementation and the scope of applications. Based on the above description, the content of this specification should not be construed as a limitation on the present disclosure.

It should be noted that each embodiment in this specification is described in a progressive manner, and each embodiment focuses on differences from other embodiments. For the same and similar parts in each embodiment, reference can be made to each other. As for the device disclosed in the embodiment, since it corresponds to the method disclosed in the embodiment, the description is relatively simple. The relevant details can refer to the description of the method part.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including/comprising a/an . . . " does not exclude the case that other similar elements may exist in the process, the method, the article or the device other than enumerated elements.

The invention claimed is:

1. A display device, comprising:

a display panel;

a heat source device, located on the display panel;

a first heat conductive film layer, located at a side of the display panel, wherein the first heat conductive film layer covers the heat source device; and a second heat conductive film layer, located inside the first heat conductive film layer;

wherein the first heat conductive film layer is configured to transfer heat generated by the heat source device to the second heat conductive film layer, and the second heat conductive film layer is configured to dissipate the received heat uniformly on a plane where the second heat conductive film layer is located, wherein the first heat conductive film layer comprises: a first heat conductive sub film layer and a second heat conductive sub film layer arranged in a stacked manner;

the second heat conductive sub film layer is located between the first heat conductive sub film layer and the display panel.

2. The display device according to claim 1, wherein the first heat conductive film layer comprises a first portion, a second portion and a third portion;

the first portion is located at a side of the heat source device away from the display panel;

the second portion is located at a side of the display panel where the heat source device is located;

an end of the third portion is in contact with the first portion, and another end of the third portion is in contact with the second portion;

wherein, a gap is arranged between the third portion and the heat source device.

3. The display device according to claim 2, further comprising:

a third heat conductive film layer, located between the third portion and the heat source device;

wherein the third heat conductive film layer is configured to transfer the heat generated by the heat source device to the third portion.

4. The display device according to claim 3, wherein the third heat conductive film layer comprises a heat conductive adhesive film layer.

5. The display device according to claim 4, further comprising:

a conductive foam, located between the third heat conductive film layer and the third portion.

6. The display device according to claim 2, further comprising:

a wave-absorbing material film layer, located between the first portion and the heat source device.

7. The display device according to claim 1, further comprising:

a fourth heat conductive film layer, located between the first heat conductive film layer and the display panel.

8. The display device according to claim 7, wherein the fourth heat conductive film layer is a modified adhesive film layer comprising a heat conductive filler.

9. The display device according to claim 1, further comprising:

an electrically insulating film layer, located at a side of the first heat conductive film layer away from the display panel.

10. The display device according to claim 9, wherein the electrically insulating film layer is provided with a plurality of vias running through the electrically insulating film layer.

11. The display device according to claim 10, wherein the plurality of vias are arranged in an array.

12. The display device according to claim 1, wherein the second heat conductive film layer is located between the first heat conductive sub film layer and the second heat conductive sub film layer.

13. The display device according to claim 1, wherein the first heat conductive film layer is a metal film layer.

14. The display device according to claim 1, wherein the second heat conductive film layer is a graphene film layer.

15. A display device, comprising:

a display panel;

a heat source device, located on the display panel;

a first heat conductive film layer, located at a side of the display panel, wherein the first heat conductive film layer covers the heat source device; and a second heat conductive film layer, located inside the first heat conductive film layer;

wherein the first heat conductive film layer is configured to transfer heat generated by the heat source device to the second heat conductive film layer, and the second heat conductive film layer is configured to dissipate the received heat uniformly on a plane where the second heat conductive film layer is located, wherein the first heat conductive film layer comprises a first portion, a second portion and a third portion;

the first portion is located at a side of the heat source device away from the display panel;

the second portion is located at a side of the display panel where the heat source device is located;

an end of the third portion is in contact with the first portion, and another end of the third portion is in contact with the second portion;

wherein, a gap is arranged between the third portion and the heat source device.

16. The display device according to claim 15, further comprising:

a third heat conductive film layer, located between the third portion and the heat source device;

wherein the third heat conductive film layer is configured to transfer the heat generated by the heat source device to the third portion.

17. The display device according to claim 16, wherein the third heat conductive film layer comprises a heat conductive adhesive film layer.

18. The display device according to claim 17, further comprising:

a conductive foam, located between the third heat conductive film layer and the third portion.

19. The display device according to claim 15, further comprising:

a wave-absorbing material film layer, located between the first portion and the heat source device.

20. The display device according to claim 15, further comprising:

a fourth heat conductive film layer, located between the first heat conductive film layer and the display panel.

* * * * *